United States Patent [19]

Felmlee et al.

[11] Patent Number: 5,759,152
[45] Date of Patent: Jun. 2, 1998

[54] PHASE-ALIGNED NMR SURFACE COIL IMAGE RECONSTRUCTION

[75] Inventors: Joel Felmlee; Josef P. Debbins, both of Rochester, Minn.

[73] Assignee: Mayo Foundation For Medical Education and Research, Rochester, Minn.

[21] Appl. No.: 720,824

[22] Filed: Oct. 2, 1996

[51] Int. Cl.$^6$ .................................................. A61B 05/055
[52] U.S. Cl. ........................................ 600/410; 324/309
[58] Field of Search .................................. 324/307, 309, 324/318; 128/653.2, 653.5; 600/410, 421

[56] References Cited

U.S. PATENT DOCUMENTS

| | | | |
|---|---|---|---|
| 4,812,761 | 3/1989 | Vaughan et al. | 324/307 |
| 4,833,407 | 5/1989 | Holland et al. | 324/309 |
| 5,319,309 | 6/1994 | Den Boef et al. | 324/309 |
| 5,399,570 | 3/1995 | Pelc et al. | 324/309 |
| 5,587,656 | 12/1996 | Van Heels-Bergen et al. | 324/307 |
| 5,633,585 | 5/1997 | Kuhn | 324/307 |

OTHER PUBLICATIONS

Phase Aligned Multicoil Reconstruction for High Speed Volumetric MRI Applications, 1996 Abstract for Soc. of Mag. Res. 4th Scientific Meeting, Debbins, et al.

The NMR Phased Array, MRM 16, 192–225 (1990), Roemer, et al.

Volume Imaging with MR Phased Arrays, MRM 18, 309–319 (1991), Hayes, et al.

A Four–Channel Time Domain Multiplexer: A Cost–Effective Alternative to Multiple Receivers, MRM 32: 499–504 (1994), Porter, et al.

Magnetic Resonance Imaging, Radiology 1988; 167:835–838, Hardy, et al.

Imaging Time Reduction Through Multiple Receiver Coil Data Acquisition and Image Reconstruction, MRM 29:681–688 (1993), Carlson, et al.

A Phased Array Coil for Human Cardiac Imaging, MRM 34:92–98 (1995), Constantinides, et al.

Arrays of Mutually Coupled Receiver Coils: Theory and Applications, MRM 17, 252–268 (1991), Wright, et al.

*Primary Examiner*—Marvin M. Lateef
*Assistant Examiner*—Shawna J. Shaw
*Attorney, Agent, or Firm*—Quarles & Brady

[57] ABSTRACT

An MRI system employs a multicoil array to acquire NMR data. A calibration scan is performed and a phase map is produced for each coil element in the array. A region of interest in the field of view is identified and corresponding phase values are extracted from each phase map and used to correct the phase of the k-space NMR data set acquired by each coil element in subsequent image scans. The corrected k-space NMR data sets for the coil elements are combined into a single k-space NMR data set to enable an image to be reconstructed therefrom by Fourier transformation.

9 Claims, 2 Drawing Sheets

PHASE-ALIGNED NMR SURFACE COIL IMAGE RECONSTRUCTION

BACKGROUND OF THE INVENTION

The field of the invention is nuclear magnetic resonance imaging methods and systems. More particularly, the invention relates to the use of multiple element surface coils and the reconstruction of images from MRI data acquired with such coils.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. An NMR signal is emitted by the excited spins, and after the excitation signal $B_1$ is terminated, this signal may be received and processed to form an image.

The NMR signal is typically received by a whole-body coil which is an integral part of the MRI system. However, in many applications the NMR signals are not strong and smaller coils which can be placed closer to the region of interest ("ROI") are used. Indeed, a multiple element ("phase array") surface coil, or multicoil, is often used around a region of interest (e.g., thorax, head, abdomen, extremity) to increase the image signal-to-noise ratio (S/N). Reconstruction of the raw data from the "n" separate coil elements is typically achieved by a standard method in which a magnitude image is reconstructed from each separate coil element signal, and the resulting n images are then combined to form a composite image. This combined phased array magnitude reconstruction, or "sum of squares" technique, provides up to 90% of the maximum available S/N. However, this technique requires a net data sampling bandwidth which is n times greater than that required for a single coil, and n separate two-dimensional Fourier transforms (2 DFT) and magnitude calculation operations to produce the composite image. n separate receivers are also required, unless modifications are made to the receiver hardware. For high speed imaging applications, including real-time MRI and high bandwidth applications such as echo-planar imaging and multicoil phase contrast, the additional S/N gained from using multiple element surface coils is often critical to a successful exam. However, using the standard "sum of squares" reconstruction can pose significant temporal limitations to the reconstruction, particularly as demands for reduced image acquisition time and improved spatial resolution increase. Continuous, or fluoroscopic, acquisitions also demand greater temporal throughput which is not accommodated with the current reconstruction methodology.

SUMMARY OF THE INVENTION

The present invention is a method for reconstructing an image from the NMR signals produced by a multicoil system. More specifically, a calibration scan is conducted in which a phase map is reconstructed from NMR data acquired by each separate coil element. A region of interest within the field of view of the image to be acquired is selected and phase values ($\theta_i$) for each coil element are determined from corresponding locations in their respective phase maps. A normal imaging scan using the calibrated multicoil system is then performed to acquire k-space data from each coil element, the phase of this k-space data is corrected using the corresponding phase value $-\theta_i$, the corrected k-space data from all the coil elements is combined, and an image is reconstructed from the combined k-space data.

A general object of the invention is to reduce the image reconstruction time for NMR data acquired using a multicoil system. Rather than separately reconstructing each coil element k-space data set and combining the resulting "image space" data sets, the present invention enables the combination to be made prior to image reconstruction. As a result, only a single 2D or 3D Fourier transformation is required and only a single magnitude calculation of the transformed data is required. This is particularly important where "real time" or nearly real time image reconstruction processing speeds are required.

Another object of the invention is to maintain the signal-to-noise advantage obtained by using a multicoil system. It has been discovered that the "phase aligned" reconstruction method of the present invention preserves the signal-to-noise ratio advantage in the selected region of interest. A significant advantage is maintained over roughly 50% of the image field of view.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

The phase-aligned multicoil reconstruction of the present invention functions by first aligning the phase of the complex k-space data from each coil element and summing the results prior to image reconstruction. The net measured phase $\theta_{net,i}$ of an isochromat in the sample as seen by the $i^{th}$ active coil element is given by:

$$\theta_{net,i} = \Psi + \theta_{g,i} + \theta_{e,i} + \theta_{r,i} \qquad (1)$$

where $\Psi$ is the isochromat phase as determined by the pulse sequence timing, main magnetic field (including inhomogeneities) and encoding process. The terms $\theta_{g,i}$, $\theta_{e,i}$ and $\theta_{r,i}$ arise from the coil geometry and position, coil electrical configuration and receiver phase shifts, respectively.

Figure 2:
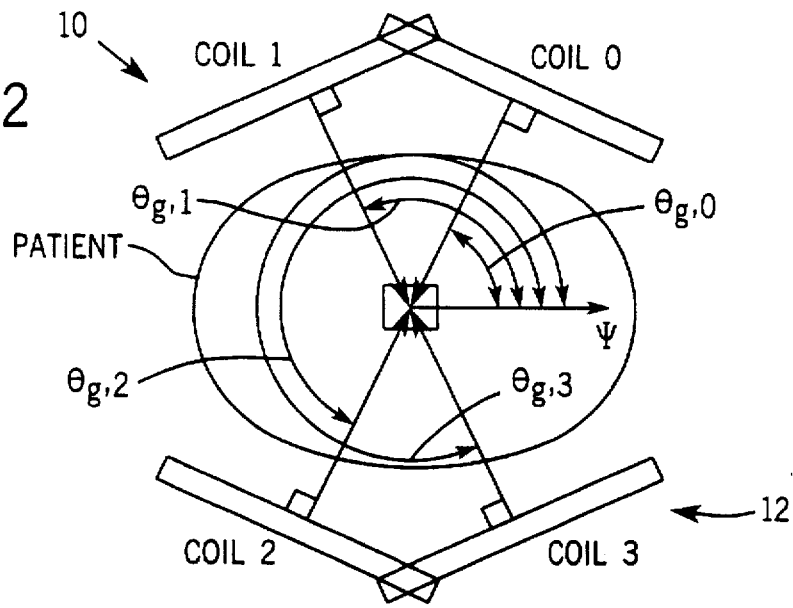
FIG. 2 is a schematic diagram showing the coil elements in a multicoil array disposed around a patient.

As shown in FIG. 2, the phase of the measured signal at each coil element from the targeted region reflects the isochromat phase $\Psi$ of that region as well as the respective geometric phase angle $\theta_{g,i}$. Adjacent coils are often wired 180° out of phase, while the posterior and anterior coil pairs also receive the isochromat phase in opposed fashion, introducing the electrical $\theta_{e,i}$ term. The separate receivers assigned to each coil element can introduce an additional phase term $\theta_{r,i}$ which varies primarily due to timing between the receiver and the transmitter. In principle, the phase relationship between coils can vary for each voxel of the imaging volume. However, in practice it is found that around the desired region of interest (within 10% of the FOV), the phases in adjacent voxels are very similar (variation of ±5%). As demonstrated by our phantom experiments, the resulting "regional" phase alignment permits improved S/N in a region as large as 50% of the field of view. A calibration scan for a small region of interest is generally sufficient to measure the regional $\theta_i$ terms for each coil element.

The calibration scan consists of acquiring a separate phase map from each coil element. The phase map indicates the phase of the NMR signal produced by the coil element at each pixel in the reconstructed image. The phase value $\theta_i$ for each coil element is then determined at a desired location, or small region of interest, in its corresponding phase map. Using this phase information $\theta_i$ from the calibration scan, the phase-aligned multicoil reconstruction compensates, for the $\theta$ terms for each of the n coils in the desired region of interest.

Once the phase relationships ($\theta_i$) between the coil elements for a given region of interest are measured in the calibration process, during subsequent imaging using the same multicoil device, the linearity property of the Fourier transform is exploited and the conjugate measured phase terms ($-\theta_i$) are applied to the raw k-space data acquired from each coil element. The resulting phase modified raw k-space data from each coil element is then summed to form a single raw k-space data set which is employed to reconstruct an image using only a single 2 DFT image reconstruction. No magnitude corrections are required.

If the region of interest chosen is central to the coil elements, as shown schematically in FIG. 2, the relative magnitude of the NMR signal received by each coil element is approximately equal, and thus no one coil dominates the summed signal intensity. Closer to an individual coil element, the improved S/N of the nearest coil element dominates the summation. Thus near a coil element, the summed signal intensity is preserved despite the possible misalignment of the phase when the conjugate phase terms from calibration at the central region are used.

DESCRIPTION OF THE PREFERRED EMBODIMENT

Figure 1:
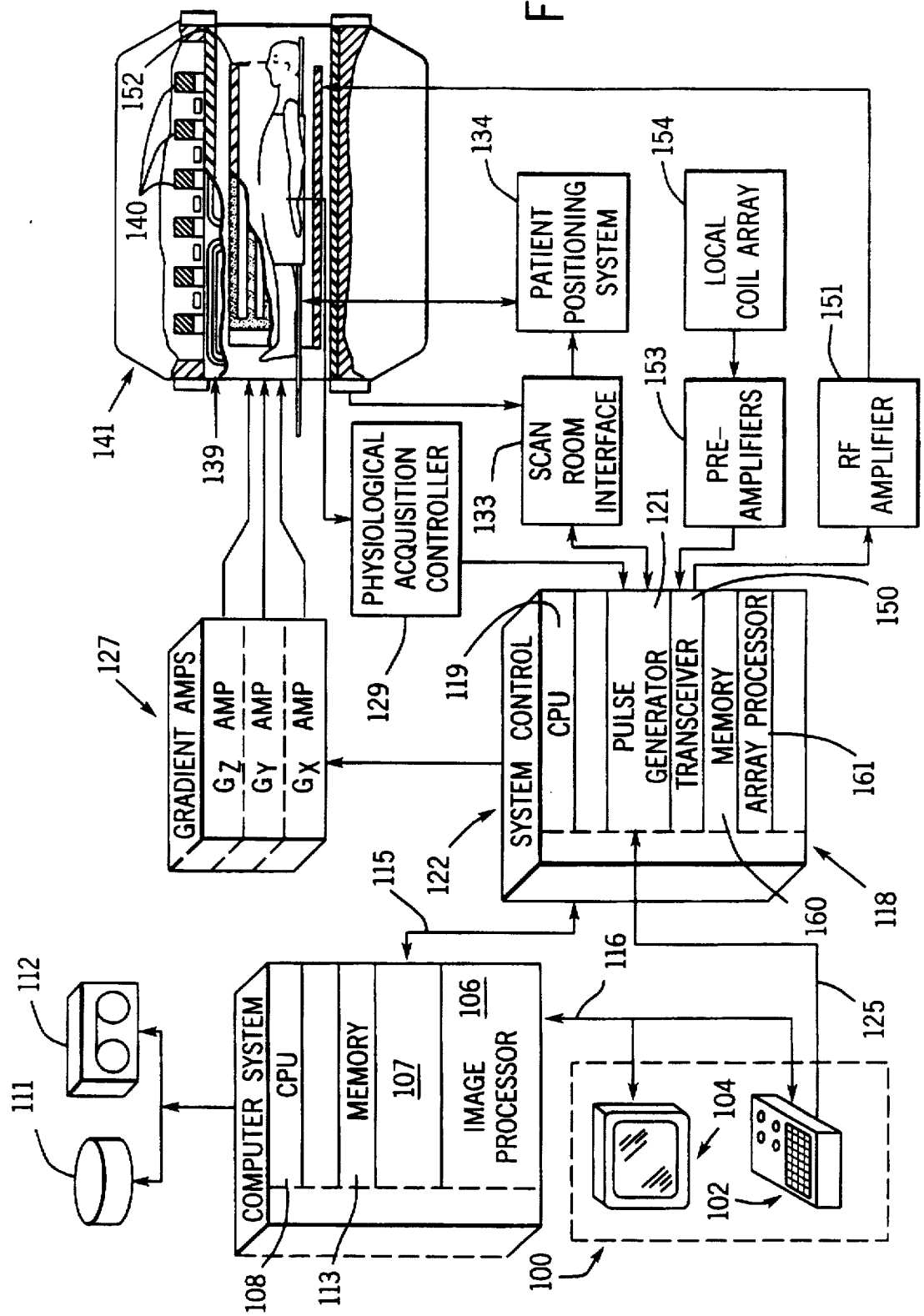
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152. The resulting signals radiated by the excited spins in the patient may be sensed by the same RF coil 152, but in the preferred embodiment a local coil array indicated at 154 is employed. The local coil array 154 is positioned around the patient anatomy to be imaged and it includes four separate coil elements (not shown in FIG. 1) which receive the NMR signals that are produced during the scan. These NMR signals are separately amplified by pre-amplifiers 153 and applied to the inputs of four separate receivers in the transceiver module 150. The amplified NMR signals are demodulated, filtered, and digitized in the receiver sections of the transceiver 150 to produce four separate k-space data sets.

The local coil array 154 is similar to that disclosed in U.S. Pat. No. 4,825,162. Referring to FIG. 2, each multicoil set consists of two flexible paddles 10 and 12, each with two surface coil elements fabricated with etched copper on a flexible plastic substrate, for a total of four coil elements. Each coil element is a rectangular loop, approximately 12×25 cm. Adjacent elements are overlapped to minimize mutual inductance. The elements are tuned using capacitors distributed around each element, and interface circuitry is added to permit detuning of the element during RF transmission. The coils are positioned anterior and posterior to the imaging volume as depicted in FIG. 2.

The NMR signals picked up by the coil array 154 are digitized by the transceiver module 150 and transferred to a memory module 160 in the system control 122. When the image scan is completed the four resulting k-space data sets are processed as will be described in more detail below to produce an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

Figure 3:
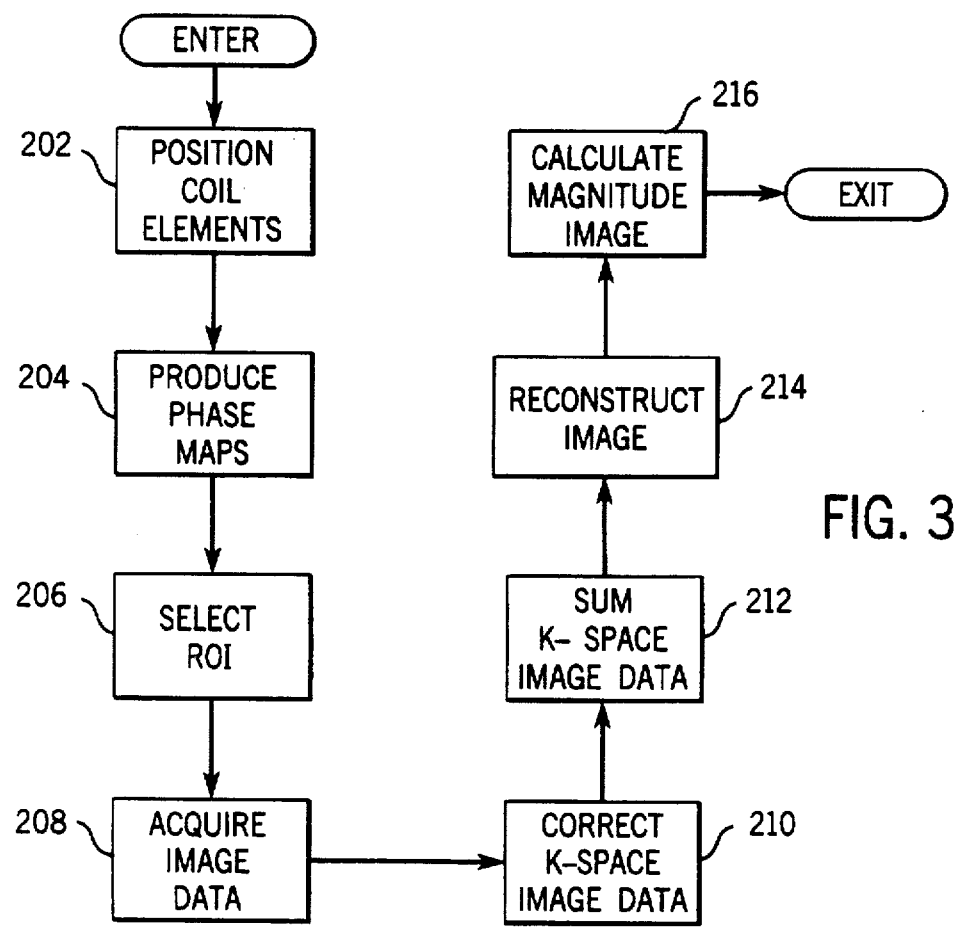
FIG. 3 is a flow chart of the process used to reconstruct an image according to the preferred embodiment of the invention.

As indicated by the flow chart in FIG. 3, the first step in the scan according to the present invention is to position the flexible paddles 10 and 12 around the desired region of interest as indicated at process block 202. A calibration scan is then performed to produce phase maps as indicated at process block 203.

The phase maps can be produced using any NMR pulse sequence. Rather than computing the modulus at each pixel in the reconstructed image, however, the phase at each pixel (i) is calculated using the complex quadrature values $I_i$ and $Q_i$:

$$\theta_i = T_{an}^{-1}(I_i/Q_i).$$

In the preferred embodiment a standard 2 DFT spin echo pulse sequence is employed with a TE of 20 msec and a TR of 200 msec. A 256 by 256 pixel array is produced. The phase maps provide a phase value $\theta_i$ for each pixel in the field of view of the image that is to be produced.

The operator is then given the opportunity to select a region of interest ("ROI") in the image at which maximum SNR is desired, as indicated at process block 206. This is accomplished by reconstructing a scout image using the NMR data acquired during the calibration scan. The image is displayed to the operator on display 104 (FIG. 1) and the operator positions a cursor at the desired ROI using the control panel 102. The phase value $\theta_i$ at the corresponding location in each of the four phase maps is then selected and stored. As an alternative, the phase values for a group of pixels surrounding the selected ROI may be averaged together to form the phase value $\theta_i$ for each coil element.

As indicated at process block 208 the image data is then acquired using the chosen pulse sequence. The image scan produces four arrays of k-space image data, one array for each coil element. The k-space image data is complex data having a phase determined by the relative values of its I and Q components. This k-space data is corrected as indicated at process block 210 by shifting the phase of each complex array value by the conjugate of its corresponding phase value $\theta_i$ measured during the calibration scan. After these phase corrections are made, the four corrected k-space image data arrays are summed together as indicated at process block 212. The signals produced by the four separate coil elements are thus combined into a single k-space image data array before any image reconstruction steps are performed.

As indicated at process block 214, an image is reconstructed from the single, combined k-space image data array. This may be a 2 DFT or a 3 DFT depending on the pulse sequence used during the scan. A magnitude image is then produced from the resulting complex image data by calculating the square root of the sum of the squares of the I and Q values at each pixel location as indicated at process block 216.

If a series of images are to be rapidly produced, the process loops back to process block 208 to acquire the image data for the next frame. By using the present invention the rate at which each frame can be produced with the improved S/N performance expected of a multicoil array is substantially increased. For example, using a real-time MR fluoroscopy acquisition as described in "Real-time MR Fluoroscopic Data Acquisition and Image Reconstruction", Magn. Reson. Med., 12, 407–415 (1989), a conventional four coil element reconstruction requires approximately 690 msec. for a full 256 by 256 element reconstruction. This reconstruction time is often the frame rate limiting factor. In comparison, by using the present invention which requires only a single Fourier transformation and a single magnitude calculation, a 270 msec. reconstruction time is required. The frame rate may thus be more than doubled over the conventional multicoil reconstruction method. And this is accomplished without any significant reduction of S/N, at least in the vicinity of the selected ROI.

We claim:

1. In an MRI system, a method for reconstructing an image of a subject using NMR data acquired using a multicoil system, the steps comprising:
   a) performing a calibration scan in which NMR data is acquired from a subject by each coil element in a multicoil system;
   b) reconstructing a phase map for each coil element using the NMR data acquired during the calibration scan;
   c) selecting a region of interest in the subject and extracting from each phase map a phase value $\theta_i$ at a location corresponding to the selected region of interest;
   d) performing a scan of the subject to acquire a k-space NMR image data set for each coil element;
   e) correcting the phase of each k-space NMR image data set using the phase value $\theta_i$ extracted from its corresponding phase map to produce corrected k-space NMR image data sets;
   f) combining the corrected k-space image data sets to form a combined k-space image data set; and
   g) reconstructing an image using the combined k-space NMR image data set.

2. The method as recited in claim 1 in which step g) is accomplished by performing a Fourier transformation of the combined k-space NMR image data set.

3. The method as recited in claim 1 in which step b) is accomplished by reconstructing an image from the calibration NMR data to produce complex image data, and calculating the phase at locations in the image from said complex image data.

4. The method as recited in claim 1 in which the region of interest is selected in step c) by identifying a location in a scout magnitude image of the subject.

5. The method as recited in claim 1 in which step c) is accomplished by extracting a single value from each phase map.

6. The method as recited in claim 1 in which step c) is accomplished by extracting a plurality of values from each phase map in the vicinity of said corresponding location, and the phase value $\theta_i$ is calculated from said extracted values.

7. The method as recited in claim 1 in which each k-space NMR image data set is comprised of an array of complex values, and the correction to each k-space NMR image data set in step e) is accomplished by changing the phase indicated by each complex value therein by an amount determined by the corresponding phase value $\theta_i$.

8. The method as recited in claim 1 in which each corrected k-space image data set is comprised of an array of complex values and step f) is accomplished by adding together the corresponding complex values in all of the corrected k-space image data sets.

9. The method as recited in claim 1 in which the multicoil system includes four coil elements.

* * * * *